United States Patent
Wang et al.

(10) Patent No.: US 10,640,862 B2
(45) Date of Patent: May 5, 2020

(54) METHOD FOR FORMING FILM AND METHOD FOR FORMING ALUMINUM NITRIDE FILM

(71) Applicant: BEIJING NAURA MICROELECTRONICS EQUIPMENT CO., LTD, Beijing (CN)

(72) Inventors: Jun Wang, Beijing (CN); Boyu Dong, Beijing (CN); Bingliang Guo, Beijing (CN); Yujie Geng, Beijing (CN); Huaichao Ma, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 193 days.

(21) Appl. No.: 15/547,559

(22) PCT Filed: Sep. 27, 2016

(86) PCT No.: PCT/CN2016/100297
§ 371 (c)(1),
(2) Date: Jul. 31, 2017

(87) PCT Pub. No.: WO2017/215146
PCT Pub. Date: Dec. 21, 2017

(65) Prior Publication Data
US 2018/0230586 A1     Aug. 16, 2018

(30) Foreign Application Priority Data

Jun. 12, 2016    (CN) .......................... 2016 1 0409464

(51) Int. Cl.
    *C23C 14/35*     (2006.01)
    *C23C 14/06*     (2006.01)
    (Continued)

(52) U.S. Cl.
    CPC ...... *C23C 14/0641* (2013.01); *C23C 14/0617* (2013.01); *C23C 14/35* (2013.01);
    (Continued)

(58) Field of Classification Search
    CPC . C23C 14/0617; C23C 14/0641; C23C 14/35; H01L 21/02178; H01L 21/0242;
    (Continued)

(56) References Cited

U.S. PATENT DOCUMENTS 5,256,266 A * 10/1993 Blanchette .......... C04B 41/5031
                                                   204/192.22
5,571,603 A * 11/1996 Utumi ..................... C30B 23/02
                                                       428/212
5,691,738 A * 11/1997 Arai ....................... H05B 33/06
                                                        345/76

FOREIGN PATENT DOCUMENTS

CN        H0465803 A     3/1992
CN        104862659 A    8/2015
(Continued)

OTHER PUBLICATIONS

Machine Translation 04-065803 (Year: 1992).*
(Continued)

*Primary Examiner* — Rodney G McDonald
(74) *Attorney, Agent, or Firm* — Anova Law Group, PLLC

(57) ABSTRACT

The present disclosure provides a method for forming a film and a method for forming an aluminum nitride film, in which two steps of pre-sputtering having different process parameters are respectively performed before performing a main sputtering, so as to achieve the effect of stabilizing target condition. The method for forming a film of the present disclosure may also form an aluminum nitride film on a substrate, and the aluminum nitride film may serve as a buffer layer between a substrate and a gallium nitride layer (Continued)

in an electronic device, so as to improve film qualities of the aluminum nitride film and the gallium nitride layer and achieve the purpose of improving performance of the electronic device.

18 Claims, 3 Drawing Sheets

(51) Int. Cl.
*H01L 21/02* (2006.01)
*H01L 23/29* (2006.01)
(52) U.S. Cl.
CPC ...... *H01L 21/0242* (2013.01); *H01L 21/0254* (2013.01); *H01L 21/02178* (2013.01); *H01L 21/02458* (2013.01); *H01L 21/02631* (2013.01); *H01L 23/291* (2013.01)
(58) Field of Classification Search
CPC ........... H01L 21/02458; H01L 21/0254; H01L 21/02631; H01L 23/291
USPC .......................... 204/192.12, 192.15, 192.18
See application file for complete search history.

(56) References Cited

FOREIGN PATENT DOCUMENTS

| | | |
|---|---|---|
| JP | H04160144 A | 6/1992 |
| JP | H09227860 A | 9/1997 |

OTHER PUBLICATIONS

Machine Translation 04-160144 (Year: 1992).*
The World Intellectual Property Organization (WIPO) International Search Report for PCT/CN2016/100297 dated Mar. 20, 2017 5 Pages.

* cited by examiner

US 10,640,862 B2

METHOD FOR FORMING FILM AND METHOD FOR FORMING ALUMINUM NITRIDE FILM

CROSS-REFERENCES TO RELATED APPLICATION

This application is a national phase entry under 35 U.S.C. § 371 of International Application No. PCT/CN2016/100297, filed on Sep. 27, 2016, which claims priority to Chinese Patent Application No. CN201610409464.7, filed on Jun. 12, 2016. The above enumerated patent applications are incorporated by reference herein in their entirety.

FIELD OF THE DISCLOSURE

The present disclosure relates to a semiconductor process, and particularly relates to a method for forming a film and a method for forming an aluminum nitride film.

BACKGROUND

Physical vapor deposition (PVD) sputtering process has been widely used in current processes of semiconductor integrated circuits, light emitting diodes (LEDs), solar batteries, displays, and the like. In a chamber of a PVD sputtering apparatus, generally, by connecting a high-power DC power supply to a target, applying power to excite a working gas in the chamber into plasma and attracting ions in the plasma to bombard the target, material of the target is sputtered off to be deposited on a substrate such as a wafer. Requirements on process parameters such as sputtering power, sputtering rate and the like are generally different in different application fields, but basically, endeavor to improve film quality and film thickness uniformity and increase capacity of equipment is very clear.

BRIEF SUMMARY OF THE DISCLOSURE

To solve the above problem, the present disclosure provides a method for forming a film and a method for forming an aluminum nitride film, in which the aluminum nitride film is formed by sputtering, and two steps of pre-sputtering having different process parameters are respectively performed before a main sputtering to achieve the purpose of stabilizing film forming process and improving film thickness uniformity.

Some embodiments of the present disclosure provide a method for forming a film including steps as follows. First, a substrate is placed on a carrying base. Then, a first pre-sputtering is performed using a provided target. After the first pre-sputtering, a second pre-sputtering is performed using the target. While performing the first pre-sputtering and the second pre-sputtering, a shielding plate is positioned between the target and the carrying base. After the second pre-sputtering, the shielding plate is moved away, and a main sputtering is performed on the substrate using the target to form a film on the substrate, wherein the first pre-sputtering and the second pre-sputtering have different process parameters.

Some embodiments of the present disclosure provide a method for forming an aluminum nitride film including steps as follows. First, a substrate is placed on a carrying base. Then, a first pre-sputtering is performed using a target containing aluminum. After the first pre-sputtering, a second pre-sputtering is performed using the target containing aluminum. While performing the first pre-sputtering and the second pre-sputtering, a shielding plate is positioned between the target containing aluminum and the carrying base. After the second pre-sputtering, the shielding plate is moved away, and a main sputtering is performed on the substrate using the target containing aluminum to form an aluminum nitride film on the substrate, wherein the first pre-sputtering and the second pre-sputtering have different process parameters.

In the method for forming a film of the present disclosure, two steps of pre-sputtering having different process parameters are respectively performed using a same target before performing the main sputtering, so that condition of the target can be stabilized, and negative impact on film thickness uniformity due to relatively long-time operation using same sputtering process parameters can be compensated, thereby improving film quality, film thickness uniformity and the like.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Hereinafter, embodiments consistent with the disclosure will be described with reference to the drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure.

Other embodiments of the disclosure will be apparent to those skilled in the art from consideration of the specification and practice of the disclosure provided herein. It is intended that the specification and examples be considered as exemplary only, with a true scope and spirit of the present disclosure being indicated by the claims.

In the method for forming a film of the present disclosure, two steps of pre-sputtering are respectively performed using a same target before performing a main sputtering, so that condition of the target can become stable before the main sputtering. In addition, the two steps of pre-sputtering have different process parameters, in which negative impact on film thickness uniformity due to relatively long-time operation using same sputtering process parameters can be compensated, thereby improving film quality and film thickness uniformity.

An aluminum nitride film formed using the method of the present disclosure has good quality, and helps to improve epitaxy quality of a gallium nitride layer that is subsequently formed on the aluminum nitride film. The aluminum nitride film and the gallium nitride layer may be applied in an electronic device such as a light emitting diode device, a gallium nitride layer with improved film quality can improve electrical performance of the electronic device, and an aluminum nitride film having improved thickness uniformity also facilitates stability of mass production of electronic devices.

Figure 1:
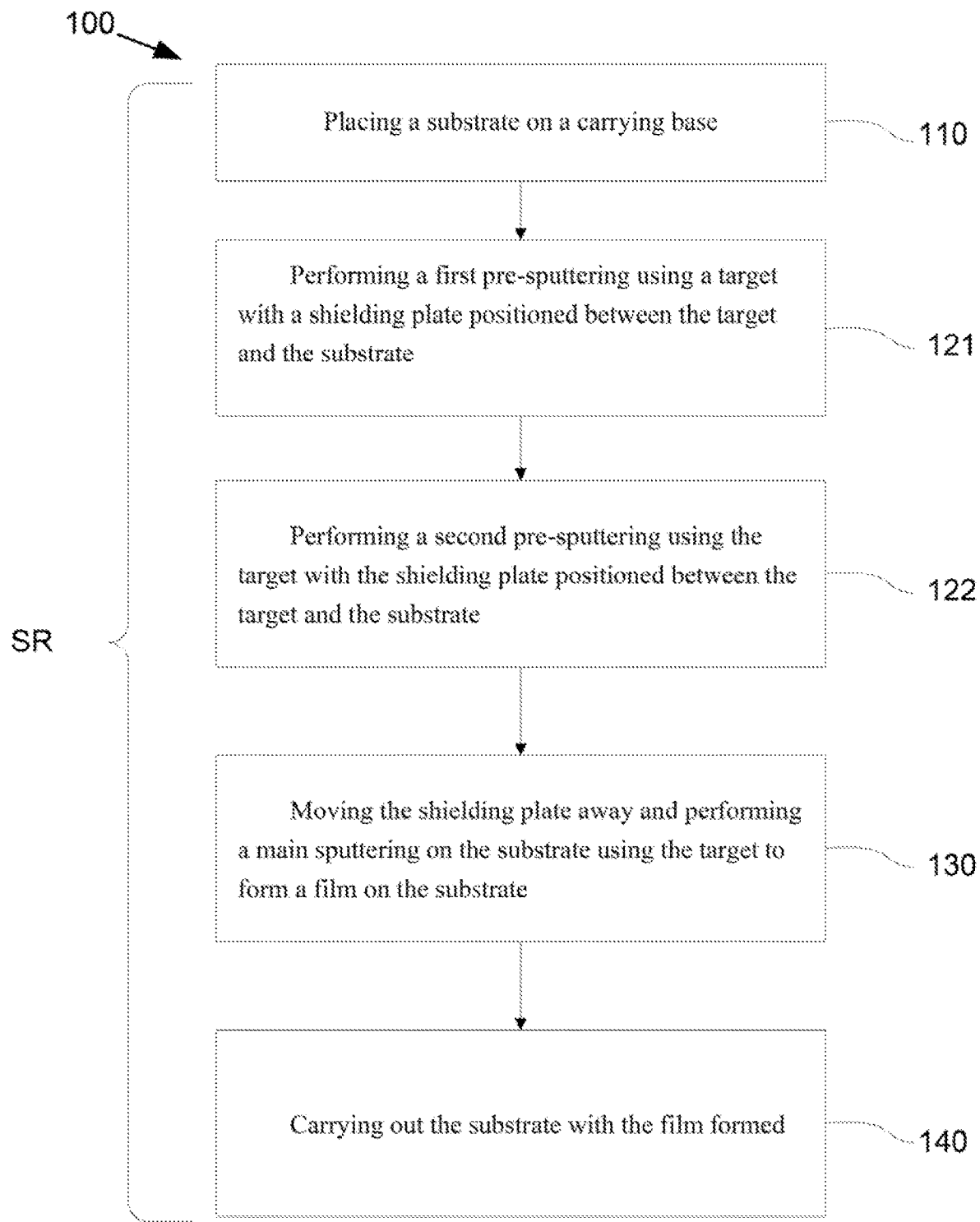
FIG. 1 is a schematic flowchart of a method for forming a film provided in some embodiments of the present disclosure.

FIG. 1 is a schematic flowchart of a method for forming a film provided in some embodiments of the present disclosure, and as shown in FIG. 1, some embodiments of the present disclosure provide a method 100 for forming a film. The method 100 includes multiple steps. In the method 100, a sputtering route SR is performed, and the sputtering route SR includes the following steps 110, 121, 122, 130 and 140. At step 110, a substrate is placed on a carrying base. At step 121, a first pre-sputtering is performed using a provided target. At step 122, after the first pre-sputtering, a second pre-sputtering is performed using the target. At step 130, the shielding plate is moved away, and a main sputtering is performed on the substrate using the target to form a film on the substrate. At step 140, the substrate on which the film is formed is carried out.

The above method 100 is exemplary only, and the present disclosure is not limited to the contents of the method 100, other required additional step(s) may be performed before, after and/or in the method 100, and a step in the method 100 may be replaced or omitted, or the order of the steps in method 100 may be changed in other embodiments. In addition, the word "step" used herein is not limited to a single action, and may include one single action, operation or technique, or may be a collection formed by action(s), operation(s) and/or technique(s). In addition, in the present disclosure, each sputtering route SR processes one batch of substrate(s) to form film(s) on surface(s) of the batch of substrate(s). The so-called one batch of substrate(s) refer to all the substrate(s) processed in each sputtering route, and may be one substrate or a plurality of substrates.

Figure 2A:
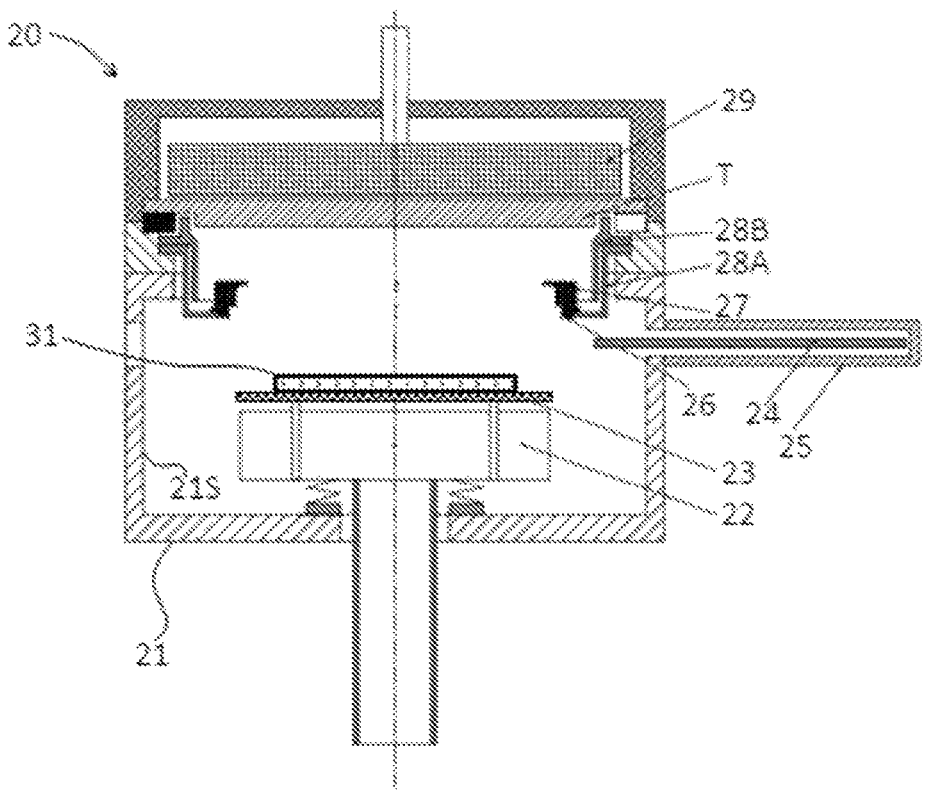
FIG. 2A is a schematic diagram of a method for forming a film provided in some embodiments of the present disclosure.
Figure 2B:
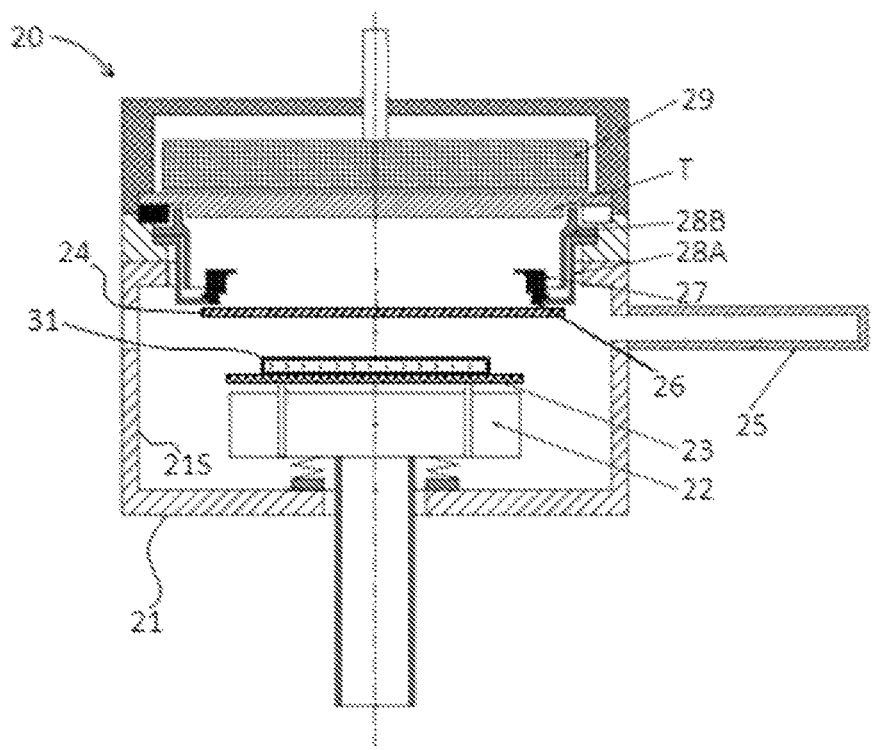
FIG. 2B is a schematic diagram of a method for forming a film provided in some embodiments of the present disclosure.
Figure 2C:
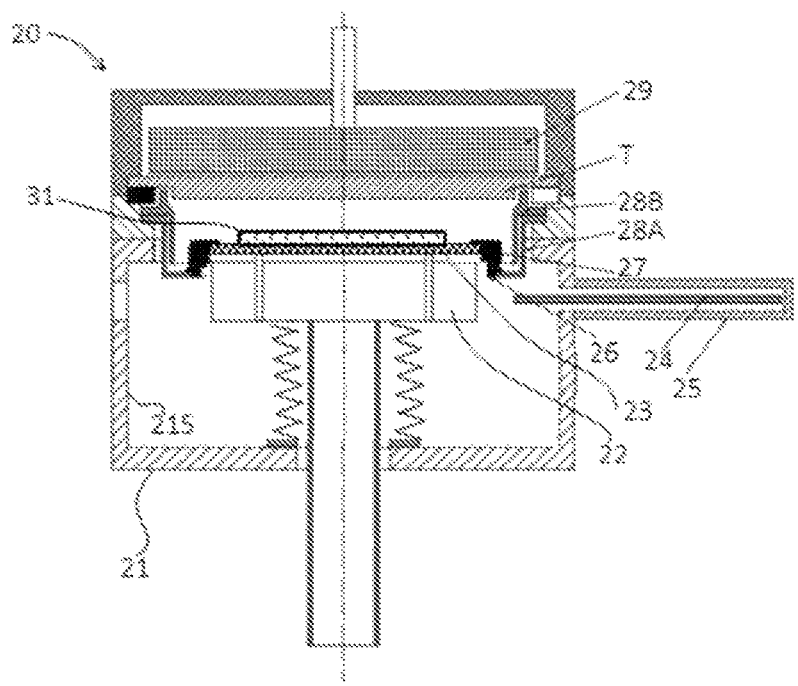
FIG. 2C is a schematic diagram of a method for forming a film provided in some embodiments of the present disclosure.

FIGS. 2A to 2C are schematic diagrams of a method for forming a film provided in some embodiments of the present disclosure. As shown in FIGS. 2A and FIG. 1, some embodiments of the present disclosure provide a method 100 for forming a film, which includes multiple steps. First, a sputtering device 20 is provided. The sputtering device 20 includes a chamber 21, a carrying base 22 and a shielding plate 24. In some embodiments, the sputtering device 20 may further include a shielding plate depository 25 for depositing the shielding plate 24, a heat isolation ring 26, a covering ring 27, a lower cover 28A, an upper cover 28B, and a magnetron 29. The shielding plate depository 25 penetrates through an inner wall 21S of the chamber 21 to communicate with the inside of the chamber 21, but this is not limited. In other embodiments of the present disclosure, other required component(s) may be provided inside and/or outside the sputtering device 20 as required. In some embodiments, the sputtering device 20 may include a magnetron sputtering device such as a RF magnetron sputtering device, a reactive magnetron sputtering device, or the like, so as to improve deposition rate and uniformity of film formed by sputtering, but this is not limited. Then, a sputtering route SR is performed, and the sputtering route SR includes steps 110, 121, 122, 130 and 140 as illustrated in FIG. 1. At step 110, a substrate 31 is loaded into the chamber 21 and placed on the carrying base 22. In some embodiments, one or more substrates 31 may be placed on a tray 23, and then the tray 23 on which the substrate(s) 31 are placed is loaded into the chamber 21 and placed on the carrying base 22 by, for example, a mechanical arm. In some other embodiments, it is also feasible to directly place the substrate(s) 31 onto the carrying base 22 instead of using the tray 23.

In some embodiments, the substrate 31 may be a sapphire substrate or a substrate formed by silicon carbide (SiC) or other proper material, such as a semiconductor substrate, a silicon-on-insulator (SOI) substrate, a glass substrate or a ceramic substrate, and the tray 23 may be made of silicon carbide (SiC) or molybdenum, but this is not limited.

Then, as shown in FIG. 2B and FIG. 1, at step 121, a first pre-sputtering is performed using a target T provided in the chamber 21, and the shielding plate 24 is positioned between the target T and the carrying base 22 during the first pre-sputtering. In some embodiment, the shielding plate 24 may be firstly placed in the shielding plate depository 25 when the first pre-sputtering is not performed yet, and before performing the first pre-sputtering, the shielding plate 24 is moved into the chamber 21 from the shielding plate depository 25 and is positioned between the target T and the substrate 31, and then the first pre-sputtering is performed. During the first pre-sputtering, the shielding plate 24 is also positioned between the target T and the substrate 31 to avoid material of the target T from being formed on the substrate 31 by the first pre-sputtering. Next, at step 122, after the first pre-sputtering, a second pre-sputtering is performed using the target T, and the shielding plate 24 is positioned between the target T and the carrying base 22 during the second pre-sputtering. In some embodiments, during the second pre-sputtering, the shielding plate 24 is also positioned between the target T and the substrate 31 to avoid material of the target T from being formed on the substrate 31 by the second pre-sputtering. In other words, the shield plate 24 may be considered as a baffle for blocking the first pre-sputtering and the second pre-sputtering to prevent the substrate 31 from being influenced. In some embodiments, the first pre-sputtering and the second pre-sputtering are performed after the substrate 31 is loaded into the chamber 21, and the shielding plate 24 is positioned between the target T and the substrate 31 and between the target T and the carrying base 22 while performing the first pre-sputtering and the second pre-sputtering, but this is not limited. In some other embodiments, it is also feasible to perform the first pre-sputtering and the second pre-sputtering before the substrate 31 is loaded into the chamber 21. It needs to be noted that the first pre-sputtering and the second pre-sputtering have different process parameters, so that condition inside the chamber 21 and condition of the target T can be stabilized, and negative impact on film thickness uniformity due to relatively long-time operation using same sputtering process parameters can be compensated, thereby improving film quality, film thickness uniformity and the like.

For example, a gas introduced into the chamber 21 during the first pre-sputtering may be different from a gas introduced into the chamber 21 during the second pre-sputtering, but this is not limited. In some other embodiments of the present disclosure, other process parameter such as power of power supply applied to the target T may be adjusted as required to make the first pre-sputtering and the second pre-sputtering have different process parameters. For example, a gas introduced into the chamber 21 during the second pre-sputtering may be different from a gas introduced into the chamber 21 during the first pre-sputtering, but be the same as a gas introduced into the chamber 21 during the main sputtering performed subsequently, but this is not limited. In some embodiments, a sputtering power applied to the target T during the first pre-sputtering may be different from a sputtering power applied to the target T during the second pre-sputtering, for example, the sputtering power applied to the target T during the second pre-sputtering may be smaller than the sputtering power applied to the target T during the first pre-sputtering, but this is not limited. In addition, in a case where the gas introduced into the chamber 21 during the first pre-sputtering and the gas introduced into the chamber 21 during the second pre-sputtering are different, preferably, no power supply is applied to the target T after the first pre-sputtering and before the second pre-sputtering, that is to say, the chamber is preferably in a non-igniting state (i.e., non-igniting in chamber 21) after the first pre-sputtering and before the second pre-sputtering, so as to ensure respective process conditions of the first pre-sputtering and the second pre-sputtering, but this is not limited. In some other embodiments, it is also feasible to perform the first pre-sputtering and the second pre-sputtering in an igniting manner as required.

Thereinafter, as shown in FIG. 2C and FIG. 1, at step 130, the shielding plate 24 is moved away, and the main sputtering is performed on the substrate 31 using the target T to form a film on the substrate 31. Process parameters of the main sputtering and process parameters of the first pre-sputtering and/or the second pre-sputtering are at least partially the same, so that the condition inside the chamber 21 becomes stable before the main sputtering, but this is not limited. For example, in some embodiments, the sputtering power applied to the target T during the first pre-sputtering may be the same as the sputtering power applied to the target T during the main sputtering, and the gas introduced into the chamber 21 during the second pre-sputtering may be the same as the gas introduced into the chamber 21 during the main sputtering, but this is not limited.

In some embodiments, the method 100 for forming a film may be used for forming a non-metal film, a metal film or a metallic compound film. For example, in a case where a film to be formed on the substrate 31 is an aluminum nitride (AlN) film, the target T may be a target containing aluminum, such as a pure aluminum target or an aluminum nitride target, and the above method 100 may be considered to be a method for forming an aluminum nitride film.

When the method 100 is used for forming an aluminum nitride film, after a substrate 31 is loaded into the chamber 21, the first pre-sputtering and the second pre-sputtering are performed using the target containing aluminum (i.e., the target T) provided in the chamber 21 (e.g., the status shown in FIG. 2B), wherein the shielding plate 24 is positioned between the target containing aluminum (i.e., the target T) and the substrate 31 while performing the first pre-sputtering and second pre-sputtering; after the second pre-sputtering, the shielding plate 24 is moved away and the main sputtering is performed on the substrate 31 using the target containing aluminum (i.e., the target T) to form an aluminum nitride film on the substrate (e.g., the status shown in FIG. 2C). In addition, when forming the aluminum nitride film, the main sputtering described above may include introducing, into the chamber 21, a gas containing nitrogen, a gas containing oxygen and an inert gas such as argon (Ar), and making ions (e.g., Ar ions) generated by the inert gas bombard the target containing aluminum (i.e., the target T) to form the aluminum nitride film on the substrate 31, and thus the formed aluminum nitride film includes oxygen-doped aluminum nitride film. For example, during the main sputtering, the gas containing nitrogen such as nitrogen gas may be introduced at a flow rate between 30 sccm (standard cubic centimeter per minute) and 300 sccm, and preferably between 100 sccm and 220 sccm; the inert gas such as argon may be introduced at a flow rate between 15 sccm and 100 sccm, and preferably between 20 sccm and 70 sccm; and the gas containing oxygen such as oxygen gas may be introduced at a flow rate between 0.5 sccm and 10 sccm, and preferably between 0.5 sccm and 5 sccm, but this is not limited. In addition, during the main sputtering, sputtering power applied to the target T may include a pulse DC power having a power in the range of 2500 watts to 4000 watts, and preferably between 2800 watts and 3500 watts, but this is not limited.

In some embodiments, the first pre-sputtering may include introducing, into the chamber 21, a gas containing nitrogen and an inert gas such as argon, without introducing a gas containing oxygen, and making ions generated by the inert gas bombard the target containing aluminum (i.e., the target T), so as to achieve the effect of cleaning the target T, for example, aluminum nitride formed on the surface of the target T due to the previous process is at least partially removed. For example, during the first pre-sputtering, the gas containing nitrogen such as nitrogen gas may be introduced at a flow rate between 30 sccm and 200 sccm, and preferably between 50 sccm and 150 sccm; the inert gas such as argon may be introduced at a flow rate between 15 sccm and 100 sccm, and preferably between 20 sccm and 70 sccm, but this is not limited. In addition, during the first pre-sputtering, sputtering power applied to the target T may be between 2500 watts and 4000 watts, and preferably between 2800 watts and 3500 watts, but this is not limited.

In some embodiments, the second pre-sputtering may include introducing, into the chamber 21, a gas containing nitrogen, a gas containing oxygen, and an inert gas such as argon, and making ions generated by the inert gas bombard the target containing aluminum (i.e., the target T), so as to modify the surface of the target T that has been cleaned through the first pre-sputtering, and thus the surface of the target T is in a state of oxygen-doped aluminum nitride (may also be considered as aluminum oxynitride, AlON). For example, during the second pre-sputtering, the gas containing nitrogen such as nitrogen has may be introduced at a flow rate between 30 sccm and 300 sccm, and preferably between 100 sccm and 220 sccm; the inert gas such as argon may be introduced at a flow rate between 15 sccm and 100 sccm, and preferably between 20 sccm and 70 sccm; the gas containing oxygen such as oxygen gas may be introduced at a flow rate between 0.5 sccm and 10 sccm, and preferably between 0.5 sccm and 5 sccm, but this is not limited. In addition, during the second pre-sputtering, sputtering power applied to the target T may be between 200 watts and 4000 watts, and preferably between 500 watts and 1500 watts, but this is not limited.

In some embodiments, applying power to the target T may be stopped after the second pre-sputtering and before the main sputtering, that is, no power is applied to the target T after the second pre-sputtering and before the main sputtering, and power is not applied to the target T for glow generation until the substrate 31 is moved to a process position and the main sputtering is about to be performed, and thus life time of the target T can be improved, but this is not limited. In other words, the above method 100 may further include performing the main sputtering after the substrate 31 is moved to a process position in the chamber 21 (e.g., the status shown in FIG. 2C) and applying power to the target T to perform the main sputtering, wherein no power is applied to the target T after the second pre-sputtering and before the substrate 31 is moved to the process position.

Then, at step 140, the substrate 31 on which the film (e.g., the aluminum nitride film described above) is formed is moved out of the chamber 21, thus completing the sputtering route SR for one time. In other words, in some embodiment, one sputtering route SR refers to a flow in which the tray 31 on which one or more substrates 31 (i.e., one batch of substrates 31) are placed is loaded into the chamber 21, thereinafter, the first pre-sputtering and the second pre-sputtering are performed and the main sputtering is performed on the one or more substrates 31 on the tray 31 (i.e., one batch of substrates 31) to form a film, and then the tray 23 is moved out of the chamber 21. In the method of the present disclosure, the first pre-sputtering and the second pre-sputtering adopt different process parameters, so that condition inside the chamber 21 and condition of the target T can be stabilized, and negative impact on film thickness uniformity due to relatively long-time operation using same sputtering process parameters can be compensated, thereby improving film quality, film thickness uniformity and the like. For example, please refer to the following Table 1 and Table 2. Table 1 shows thickness conditions of aluminum nitride films formed using a method of a comparative example (in which pre-sputtering and main-sputtering have the same parameters), and in each sputtering route, the main sputtering is performed on 5 substrates placed on the tray (i.e., each batch of substrates include 5 substrates); Table 2 shows thickness conditions of aluminum nitride films formed using the above method 100 (in which two steps of pre-sputtering having different process parameters are performed), and in each sputtering route, the main sputtering is also performed on 5 substrates placed on the tray (i.e., each batch of substrates include 5 substrates). It can be known from the results shown in Tables 1 and 2 that, if the process parameters of the pre-sputtering are the same as those of the main sputtering, both thickness uniformity of the aluminum nitride film formed on a single substrate and thickness uniformities of the aluminum nitride films formed on the 5 substrates on a same tray (i.e., the substrates in a same batch) are obviously worse than those of the aluminum nitride films formed using the method of the present disclosure (two steps of pre-sputtering having different process parameters are performed in the present disclosure). In addition, the above-described sputtering route of the present disclosure is performed continuously for 20 times, and the results show that for each batch of substrates, each substrate has very good film thickness uniformity, and the film thickness uniformity among different substrates is also very good; moreover, for different batches of substrates, the film thickness uniformity among different batches is also improved. In other words, by using the method for forming a film of the present disclosure, film thickness uniformity can be effectively improved.

TABLE 1

| | Substrate No. | Thickness (Å) | Non-uniformity within a single substrate | Non-uniformity among substrates |
|---|---|---|---|---|
| 1st tray | 1 | 143.8 | 1.83% | 2.88% |
| | 2 | 149.7 | 1.32% | |
| | 3 | 140.6 | 1.45% | |
| | 4 | 139.2 | 1.69% | |
| | 5 | 145.3 | 2.41% | |

TABLE 1-continued

| | Substrate No. | Thickness (Å) | Non-uniformity within a single substrate | Non-uniformity among substrates |
|---|---|---|---|---|
| 20th tray | 1 | 136.7 | 1.97% | 2.97% |
| | 2 | 138.1 | 2.17% | |
| | 3 | 133.2 | 1.77% | |
| | 4 | 127.8 | 2.05% | |
| | 5 | 134.6 | 2.23% | |

TABLE 2

| | Substrate No. | Thickness (Å) | Non-uniformity within a single substrate | Non-uniformity among substrates |
|---|---|---|---|---|
| 1st tray | 1 | 139.9 | 0.53% | 0.29% |
| | 2 | 139.7 | 0.39% | |
| | 3 | 139.3 | 0.41% | |
| | 4 | 140.2 | 0.55% | |
| | 5 | 140.3 | 0.28% | |
| 20th tray | 1 | 141.4 | 0.84% | 0.40% |
| | 2 | 141.9 | 0.53% | |
| | 3 | 141.7 | 0.61% | |
| | 4 | 142.2 | 0.62% | |
| | 5 | 142.9 | 0.41% | |

Figure 3:
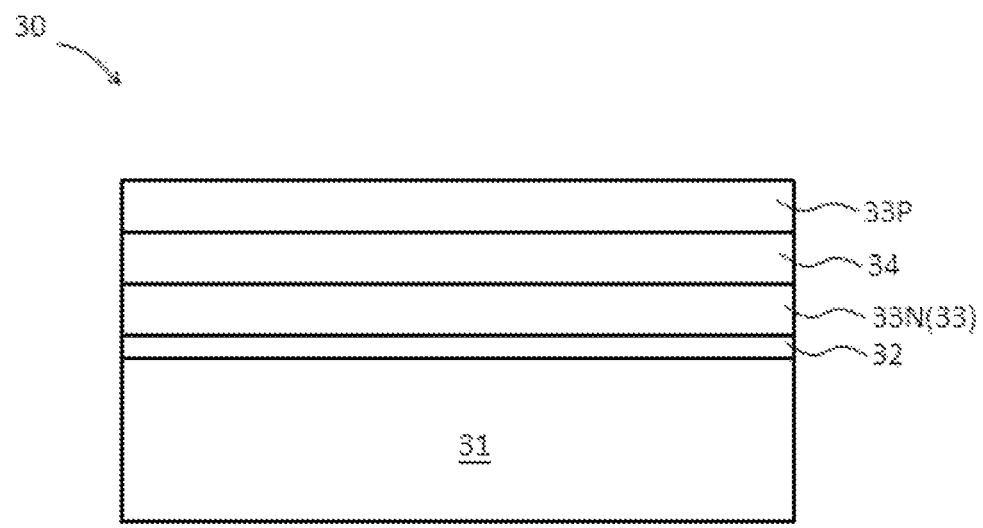
FIG. 3 is a schematic diagram of an electronic device in some embodiments of the present disclosure.

In addition, referring to FIGS. 1, 2C and 3, FIG. 3 is a schematic diagram of an electronic device in some embodiments of the present disclosure. As shown in FIGS. 1, 2C and 3, in some embodiments, the method 100 for forming an aluminum nitride film may be used for forming an aluminum nitride buffer layer 32 in an electronic device 30 such as a gallium nitride based light emitting diode (GaN-based LED) device. In some embodiments, the electronic device 30 may include a substrate 31, an aluminum nitride buffer layer 32 and a gallium nitride layer 33. The aluminum nitride buffer layer 32 is positioned on the substrate 31, and the gallium nitride layer 33 is positioned on the aluminum nitride buffer layer 32. The aluminum nitride buffer layer 32 may be formed on the substrate 31 using the above method 100, and the gallium nitride layer 33 may be formed on the aluminum nitride buffer layer 32. Because lattice mismatch and thermal mismatch degrees between the aluminum nitride buffer layer 32 and the substrate 31 (e.g., a sapphire substrate) are relatively small, the aluminum nitride buffer layer 32 can be used for improving quality of the gallium nitride layer 33 that is subsequently formed on the aluminum nitride buffer layer 32 by epitaxy, which in turn achieves the effect of improving performance of the electronic device 30. For example, the electronic device 30 may include a light emitting diode device and other suitable semiconductor electronic device. In a case where the electronic device 30 is a GaN-based LED device, the electronic device 30 may further include a quantum well layer 34 formed on the gallium nitride layer 33, and in this case, the gallium nitride layer 33 may be treated to become an N-type doped gallium nitride layer 33N, and a P-type doped gallium nitride layer 33P may be formed on the quantum well layer 34, but this is not limited. By introducing oxygen during the main sputtering for forming the aluminum nitride buffer layer 32, the film quality of the gallium nitride layer 33 subsequently formed on the aluminum nitride buffer layer 32 can be improved, and various electrical performances of the electronic device 30 can be improved.

In summary, in the method for forming a film of the present disclosure, in a same chamber in which the main sputtering is to be performed, two steps of pre-sputtering having different process parameters are performed using a same target before the main sputtering, so that the condition inside the chamber and the condition of the target are stabilized, and on the other hand, adverse influence on film thickness uniformity due to relatively long-time operation using same parameters can be compensated, thereby achieving the effects of improving film quality and film thickness uniformity. When the method for forming a film of the present disclosure is used for forming an aluminum nitride film, because both the film quality and the thickness uniformity of the aluminum nitride film are improved, the epitaxy quality of the gallium nitride layer subsequently formed on the aluminum nitride film is also improved.

The foregoing contents describe features of some implementations, so that a person of ordinary skill in the art can better understand various aspects of the disclosed contents of the present application. A person of ordinary skill in the art should understand that other process(es) or structure(s) may be readily designed or modified, on the basis of the disclosed contents of the present application, to achieve the same object(s) and/or advantage(s) as the implementations described in the present application. A person of ordinary skill in the art should also understand that the equivalent configurations do not depart from the spirit and scope of the disclosed contents of the present application, and a person of ordinary skill in the art can make various modifications, replacements and alternatives without departing from the spirit and scope of the disclosed contents of the present application.

What is claimed is:

1. A method for forming a film, comprising:
    placing a substrate on a carrying base;
    performing a first pre-sputtering using a target;
    performing a second pre-sputtering using the target after the first pre-sputtering, wherein: while performing the first pre-sputtering and the second pre-sputtering, a shielding plate is positioned between the target and the substrate, and the first pre-sputtering and the second pre-sputtering have different process parameters;
    moving the shielding plate away after the second pre-sputtering; and
    performing a main sputtering on the substrate using the target to form a film on the substrate, wherein no power is applied to the target after the second pre-sputtering and before the main sputtering.

2. The method according to claim 1, wherein: a gas introduced during the first pre-sputtering is different from a gas introduced during the second pre-sputtering.

3. The method according to claim 1, wherein: a gas introduced during the second pre-sputtering is the same as a gas introduced during the main sputtering.

4. The method according to claim 1, wherein: sputtering power applied to the target during the first pre-sputtering is different from sputtering power applied to the target during the second pre-sputtering.

5. The method according to claim 4, wherein: the sputtering power applied to the target during the second pre-sputtering is smaller than the sputtering power applied to the target during the first pre-sputtering.

6. The method according to claim 4, wherein: the sputtering power applied to the target during the first pre-sputtering is equal to sputtering power applied to the target during the main sputtering.

7. The method according to claim 1, wherein: no power is applied to the target after the first pre-sputtering and before the second pre-sputtering.

8. The method according to claim 1, further comprising:
    performing the main sputtering after the substrate is moved to a process position; and
    applying power to the target to perform the main sputtering, wherein: no power is applied to the target after the second pre-sputtering is performed and before the substrate is moved to the process position.

9. A method for forming an aluminum nitride film, comprising:
    placing a substrate on a carrying base;
    performing a first pre-sputtering using a target containing aluminum;
    performing a second pre-sputtering using the target containing aluminum after the first pre-sputtering, wherein: while performing the first pre-sputtering and the second pre-sputtering, a shielding plate is positioned between the target containing aluminum and the substrate, and the first pre-sputtering and the second pre-sputtering have different process parameters;
    moving the shielding plate away after the second pre-sputtering; and
    performing a main sputtering on the substrate using the target containing aluminum to form an aluminum nitride film on the substrate, wherein no power is applied to the target containing aluminum after the second pre-sputtering and before the main sputtering.

10. The method according to claim 9, wherein: a gas introduced during the first pre-sputtering includes a gas containing nitrogen and an inert gas.

11. The method according to claim 9, wherein: a gas introduced during the second pre-sputtering includes a gas containing nitrogen, a gas containing oxygen and an inert gas.

12. The method according to claim 9, wherein: sputtering power applied to the target containing aluminum during the first pre-sputtering is different from sputtering power applied to the target containing aluminum during the second pre-sputtering.

13. The method according to claim 12, wherein: the sputtering power applied to the target containing aluminum during the second pre-sputtering is smaller than the sputtering power applied to the target containing aluminum during the first pre-sputtering.

14. The method according to claim 12, wherein: the sputtering power applied to the target containing aluminum during the first pre-sputtering is equal to sputtering power applied to the target containing aluminum during the main sputtering.

15. The method according to claim 12, wherein: the sputtering power applied to the target containing aluminum during the first pre-sputtering is between 2500 watts and 4000 watts.

16. The method according to claim 12, wherein: the sputtering power applied to the target containing aluminum during the second pre-sputtering is between 200 watts and 4000 watts.

17. The method according to claim 9, wherein: no power is applied to the target containing aluminum after the first pre-sputtering and before the second pre-sputtering.

18. The method according to claim 9, further comprising:
    performing the main sputtering after the substrate is moved to a process position; and applying power to the target containing aluminum to perform the main sputtering, wherein no power is applied to the target containing aluminum after the second pre-sputtering is performed and before the substrate is moved to the process position.

\* \* \* \* \*